(12) United States Patent
Murugesh et al.

(10) Patent No.: US 7,431,772 B2
(45) Date of Patent: Oct. 7, 2008

(54) GAS DISTRIBUTOR HAVING DIRECTED GAS FLOW AND CLEANING METHOD

(75) Inventors: Laxman Murugesh, San Ramon, CA (US); Padmanabhan Krishnaraj, San Francisco, CA (US); Carl Dunham, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 79 days.

(21) Appl. No.: 10/797,286

(22) Filed: Mar. 9, 2004

(65) Prior Publication Data

US 2005/0199184 A1  Sep. 15, 2005

(51) Int. Cl.
*C23C 16/00* (2006.01)
*C23F 1/00* (2006.01)
*H01L 21/306* (2006.01)

(52) U.S. Cl. .............. 118/715; 156/345.33; 156/345.34

(58) Field of Classification Search ............ 156/345.33, 156/345.34; 118/715
See application file for complete search history.

(56) References Cited

U.S. PATENT DOCUMENTS

| | | | |
|---|---|---|---|
| 4,138,306 A | 2/1979 | Niwa | |
| 4,563,367 A | 1/1986 | Sherman | |
| 4,910,042 A | 3/1990 | Hokynar | |
| 4,913,929 A | 4/1990 | Moslehi et al. | |
| 4,988,644 A | 1/1991 | Jucha et al. | |
| 5,000,113 A | 3/1991 | Wang et al. | |
| 5,158,644 A | 10/1992 | Cheung et al. | |
| 5,346,579 A | 9/1994 | Cook et al. | |
| 5,350,480 A | 9/1994 | Gray | |
| 5,403,434 A | 4/1995 | Moslehi | |
| 5,662,770 A | 9/1997 | Donohoe | |
| 5,688,357 A | 11/1997 | Hanawa | |
| 5,770,098 A | 6/1998 | Araki et al. | |
| 5,792,272 A | 8/1998 | van Os et al. | |
| 5,812,403 A | 9/1998 | Fong et al. | |

(Continued)

FOREIGN PATENT DOCUMENTS

DE  41 32 559 A1  4/1993

(Continued)

OTHER PUBLICATIONS

Grill, Cold Plasma in Materials Fabrication, IEEE Press, 1994, pp. 109-110, 160-163, New York.

*Primary Examiner*—Parviz Hassanzadeh
*Assistant Examiner*—Rakesh K Dhingra
(74) *Attorney, Agent, or Firm*—Janah & Associates, P.C.

(57) ABSTRACT

A gas distributor distributes a gas across a surface of a substrate processing chamber. The gas distributor has a hub, a baffle extending radially outward from the hub, a first set of vanes and a second set of vanes. In one version, the hub has a gas inlet and a gas outlet. The baffle has an opposing first and second surfaces. First vanes are on the first surface of the baffle and direct gas across chamber surfaces. In one version, the first vanes comprise arcuate plates that curve and taper outward from the hub. Second vanes are on the second surface of the baffle and direct gas across the second surface of the baffle. In one version, a gas feed-through tube in the hub can allow a gas to bypass the first and second set of vanes.

16 Claims, 5 Drawing Sheets

U.S. PATENT DOCUMENTS

| | | | |
|---|---|---|---|
| 5,844,195 A | 12/1998 | Fairbairn et al. | |
| 5,942,804 A | 8/1999 | Mohwinkel et al. | |
| 6,039,834 A | 3/2000 | Tanaka et al. | |
| 6,060,400 A | 5/2000 | Oehrlein et al. | |
| 6,125,859 A | 10/2000 | Kao et al. | |
| 6,132,512 A * | 10/2000 | Horie et al. | 118/715 |
| 6,148,832 A | 11/2000 | Gilmer et al. | |
| 6,170,428 B1 | 1/2001 | Redeker et al. | |
| 6,182,602 B1 | 2/2001 | Redeker et al. | |
| 6,217,951 B1 | 4/2001 | Mizuno et al. | |
| 6,450,117 B1 | 9/2002 | Murugesh et al. | |
| 6,663,025 B1 * | 12/2003 | Halsey et al. | 239/554 |
| 2003/0010451 A1 * | 1/2003 | Tzu et al. | 156/345.33 |
| 2003/0116278 A1 * | 6/2003 | Wheat et al. | 156/345.33 |
| 2004/0200412 A1 * | 10/2004 | Frijlink | 118/715 |

FOREIGN PATENT DOCUMENTS

| | | |
|---|---|---|
| EP | 0 552 491 A1 | 7/1993 |
| EP | 0 697 467 A1 | 2/1996 |
| EP | 0 537 950 B1 | 4/1997 |
| JP | 1220434 | 9/1989 |
| JP | 2125876 | 5/1990 |
| WO | WO 97/03223 | 1/1997 |
| WO | WO 99/02754 | 1/1999 |
| WO | WO 99/03312 | 1/1999 |

* cited by examiner

GAS DISTRIBUTOR HAVING DIRECTED GAS FLOW AND CLEANING METHOD

BACKGROUND

The present invention relates to directing a gas flow in a substrate processing chamber.

In the fabrication of semiconductors and displays, materials are formed on a substrate by oxidation, nitridation, ion implantation, chemical vapor deposition (CVD), and physical vapor deposition (PVD) processes. The substrate deposited materials can be also etched to form features, such as interconnect lines, gates and barriers. During such processing, process residues deposit on the internal surfaces of chamber walls and on exposed chamber components. The process residues can include the material being formed or etched, as well as other materials that might result from chemical or physical events occurring during the process. Process residues can also deposit on the surfaces in a non-uniform manner. For example, residues might form in thicker layers near process gas inlets or PVD targets, and may be substantially absent in other areas of the chamber.

The process residues are periodically cleaned from the surfaces of the chamber walls and components. Unchecked build-up of residues can degrade the process being performed in the chamber and reduce substrate yields. For example, residues may flake or crumble from chamber walls during a deposition process and contaminate a layer being formed on the substrate. Also, residues collecting on or around gas inlets and outlets may adversely affect process gas flow rates or composition. Contamination of a substrate or deviation from a proscribed process recipe can lead to the unreliability or inoperability of the device being fabricated on the substrate.

In one cleaning method, residues are cleaned from surfaces in the chamber by a wet-cleaning process in which liquid solvents are applied to chamber surfaces by an operator. Wet-cleaning process are often manually implemented and thus can be slow or ineffective, resulting in extended chamber down-time or incomplete cleaning. For example, different chamber operators may scrub chamber walls with different forces resulting in different levels of cleaning of the chamber between the processing of one batch of substrates and another.

A dry-cleaning process in which an energized cleaning gas is used to etch away residues from the chamber surfaces can also be used to clean the chamber. However, dry-cleaning processes have other problems. For example, surfaces having non-uniform residues may require a prolonged exposure to the cleaning gas to clean regions having thicker residues, resulting in erosion or degradation of chamber surfaces having thinner residues. Chemically resistant or hard-to-clean residues may also require prolonged exposure to a cleaning gas, or the use of highly erosive cleaning gases, which may result in similar problems. Also, highly erosive cleaning gases can also be more toxic or environmentally unsafe.

A further problem with conventional dry-cleaning processes is that the same gas distribution system is typically used for both the process gas and the cleaning gas. Such gas delivery systems generally distribute process gases within the chamber across the substrate surface in a uniform manner to optimize substrate processing characteristics. However, as the optimal distribution of cleaning gas in the chamber can have different requirements than the distribution of process gas, conventional gas distribution systems can fail to provide satisfactory cleaning of residues formed on surfaces inside the chamber.

Thus, there is a need to clean residues from chamber surfaces that may be non-uniformly deposited or chemically resistant to cleaning, without excessive erosion of the chamber surfaces. It is also desirable to be able to distribute the cleaning gas across chamber surfaces to achieve efficient or optimized cleaning of the residues.

SUMMARY

A gas distributor distributes a gas across a surface of a substrate processing chamber. The gas distributor has a hub, a baffle extending radially outward from the hub, a first set of vanes and a second set of vanes. In one version, the hub has a gas inlet and a gas outlet. The baffle has an opposing first and second surfaces. First vanes are on the first surface of the baffle and direct gas across chamber surfaces. In one version, the first vanes comprise arcuate plates that curve and taper outward from the hub. Second vanes are on the second surface of the baffle and direct gas across the second surface of the baffle. In one version, a gas feed-through tube in the hub can allow a gas to bypass the first and second set of vanes.

A substrate processing apparatus having the gas distributor includes a remote chamber to activate a cleaning gas and a process chamber. The gas distributor receives a cleaning gas from the remote chamber and distributes the cleaning gas into the process chamber, along the interior surfaces of the process chamber, and about the gas distributor.

A method of cleaning surfaces in a substrate processing chamber comprises coupling energy to a cleaning gas in a remote chamber to form an energized cleaning gas; directing a first portion of the energized cleaning gas across a chamber surface; and directing a second portion of the energized cleaning gas across a surface of the gas distributor facing the substrate.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

Figure 1:
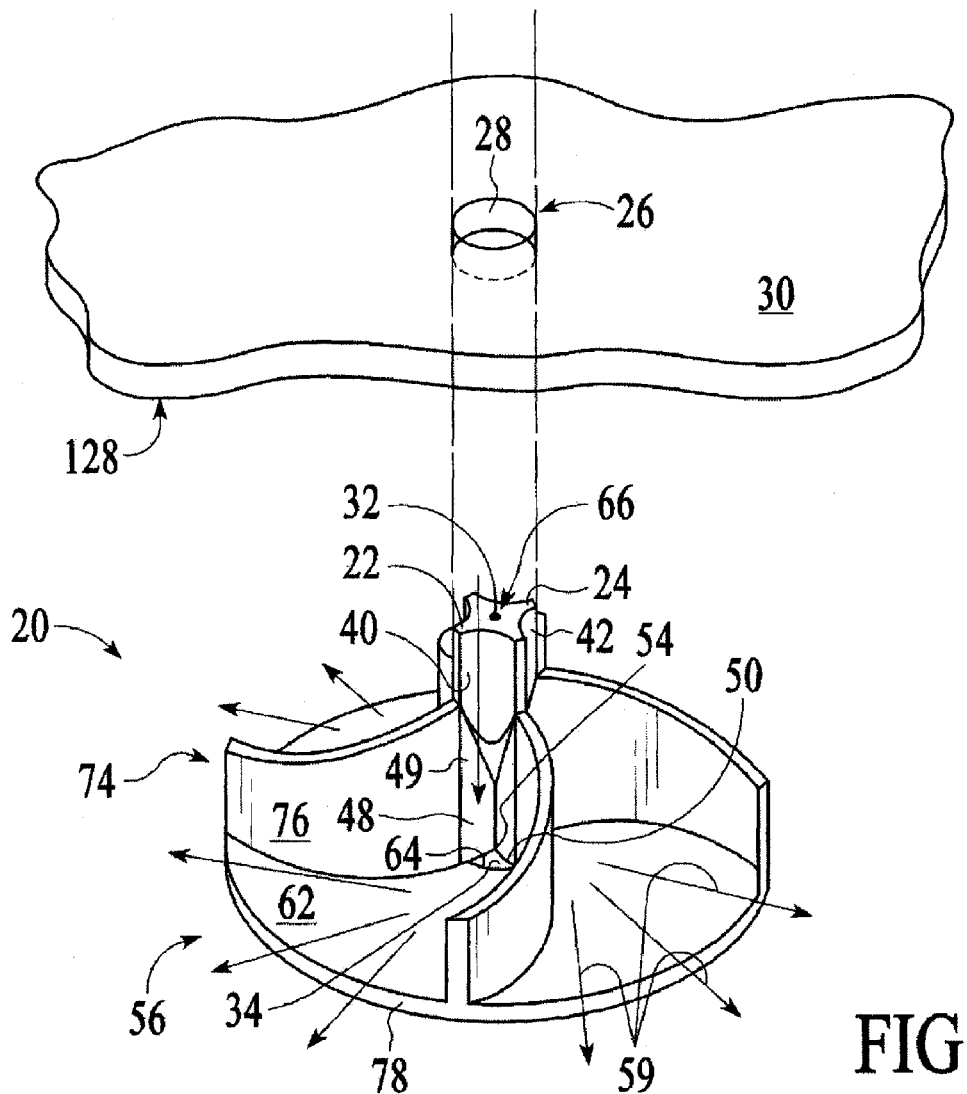
FIG. 1 is a perspective view of an embodiment of a gas distributor according to the present invention.
Figure 3A:
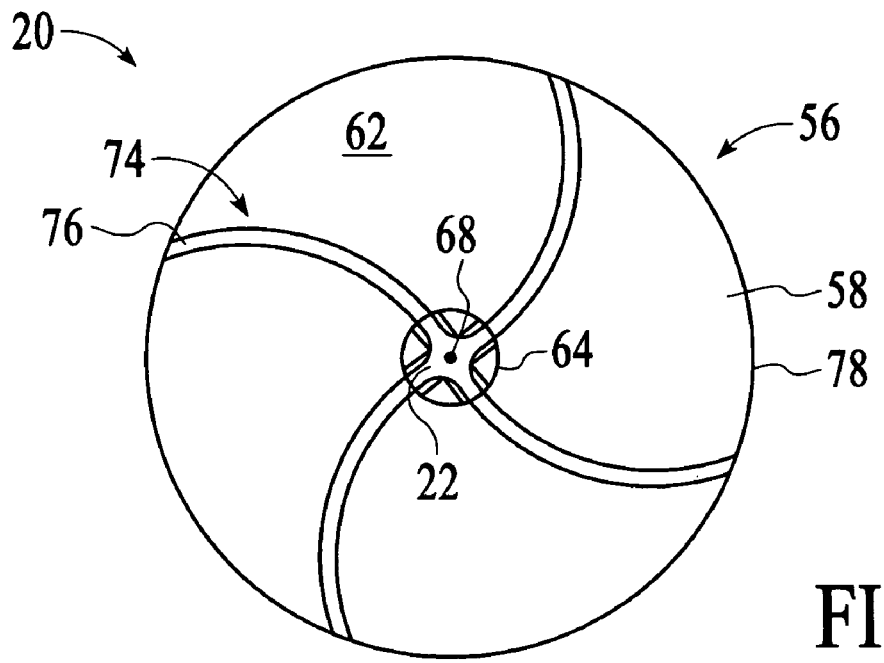
Figure 3B:
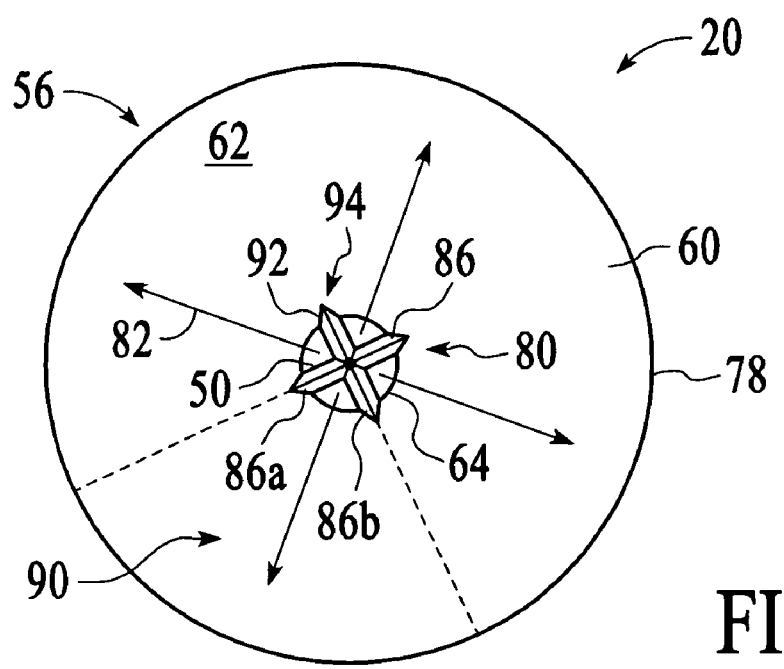
Figure 4:
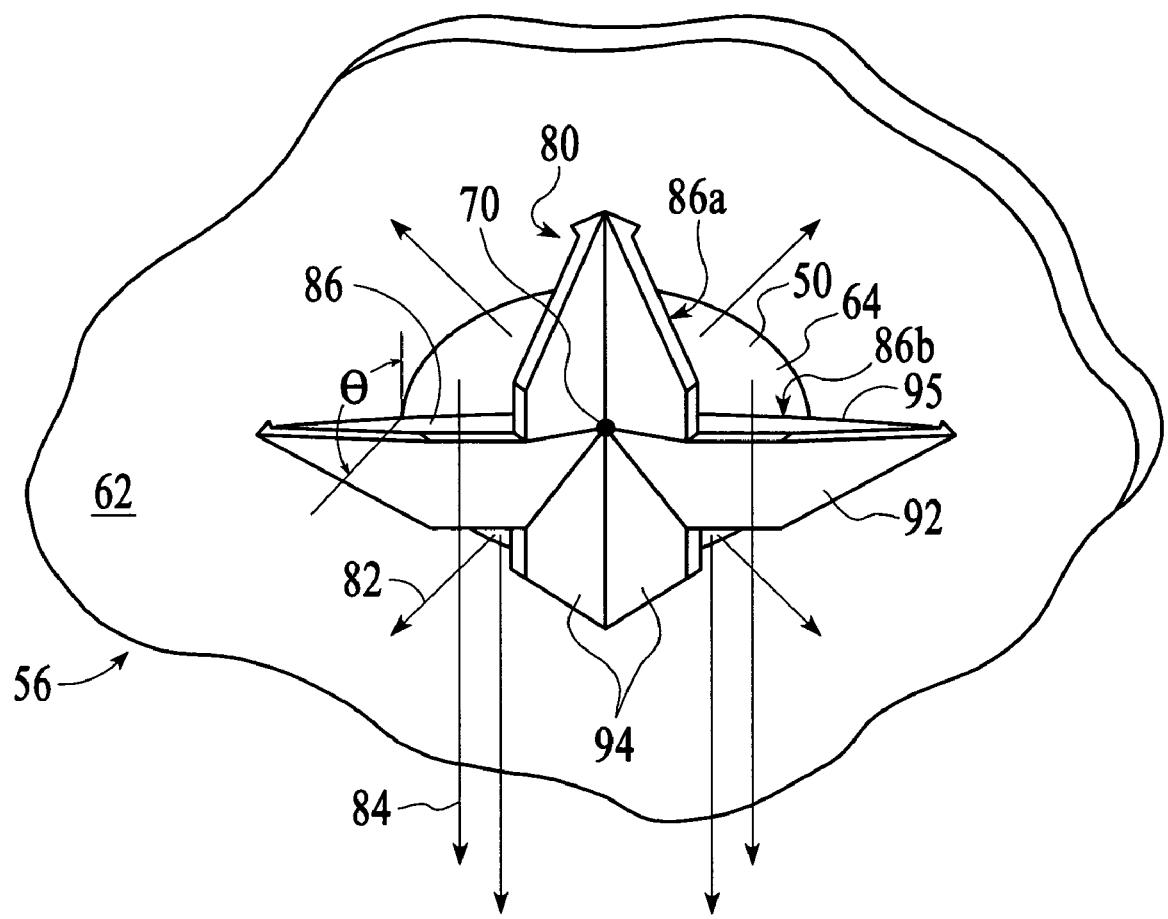
Figure 5:
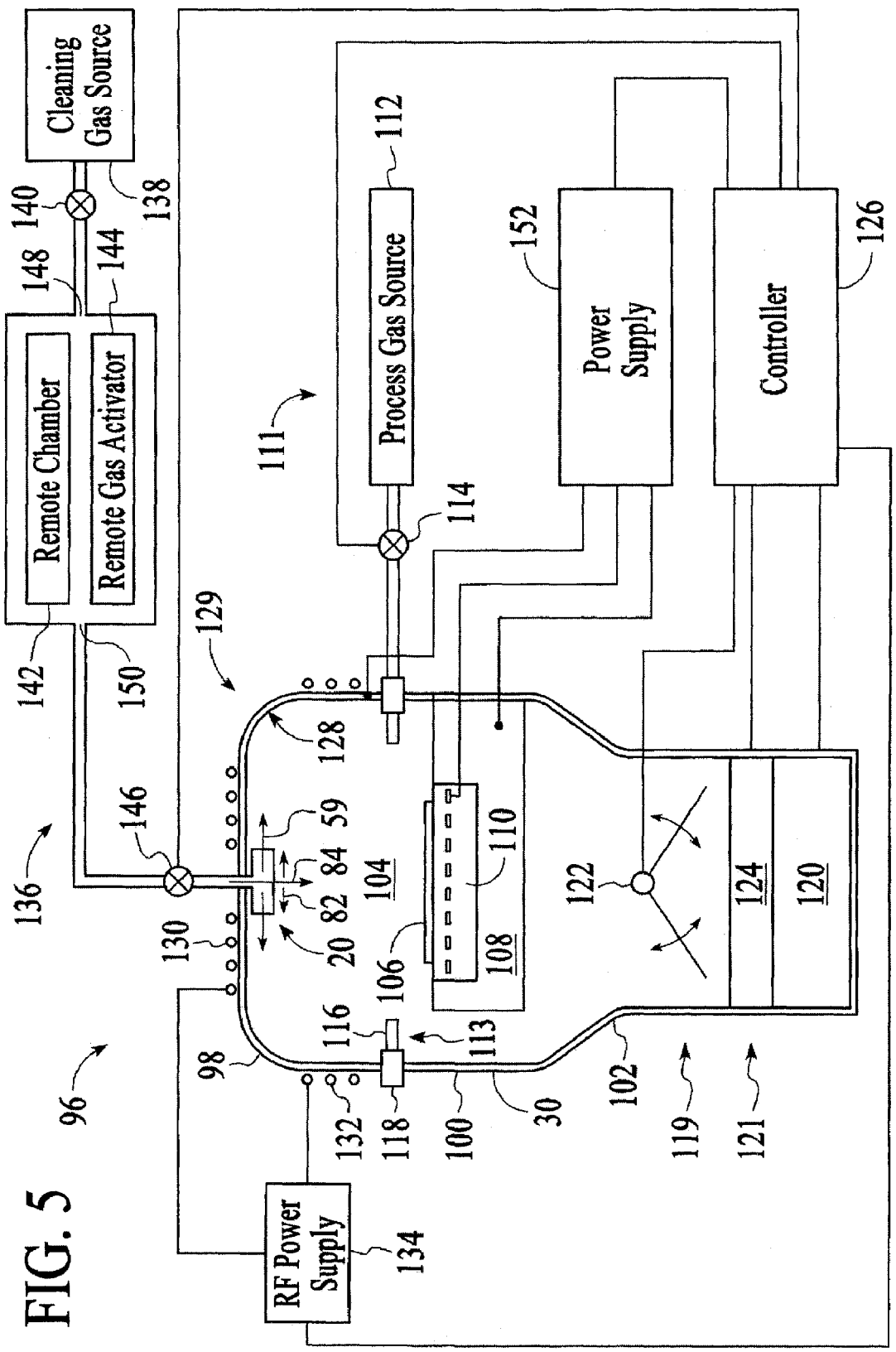
Figure 6A:
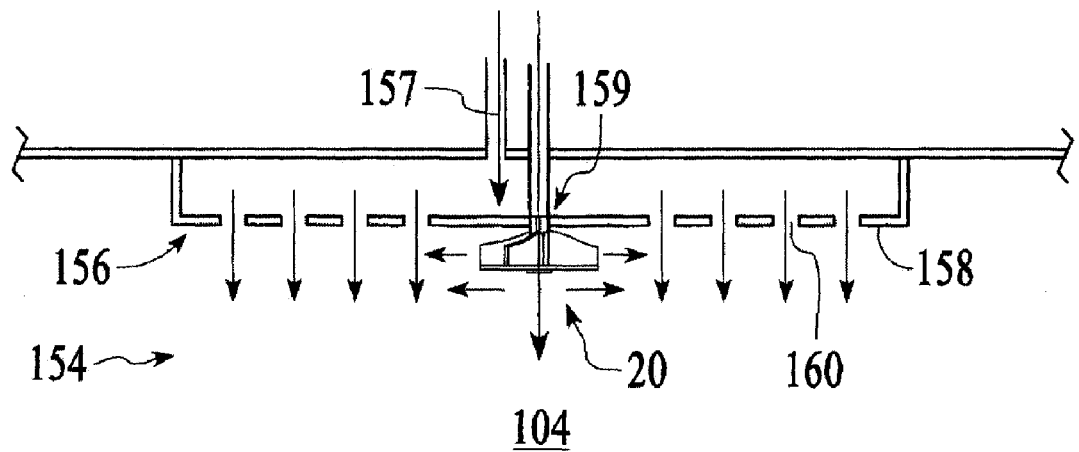
Figure 6B:
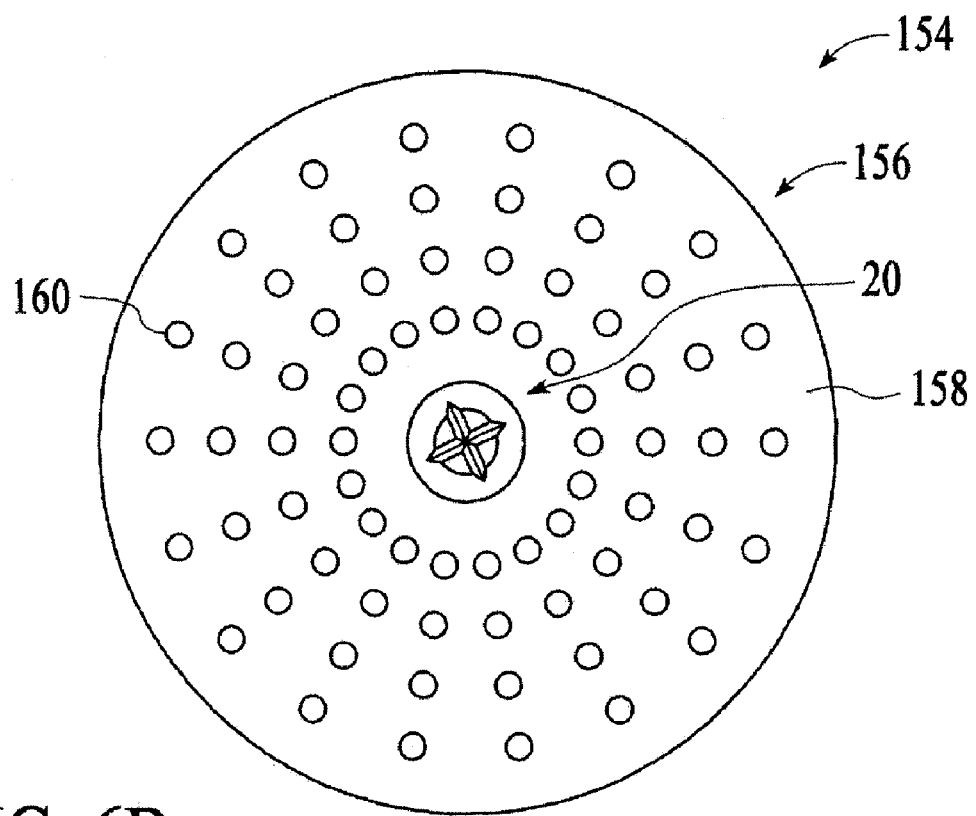

FIG. 3*a* is a top view of the gas distributor of FIG. 1;

FIG. 3*b* is a bottom view of the gas distributor of FIG. 1;

FIG. 4 is a perspective view of an embodiment of the second vanes of the gas distributor;

FIG. 5 is a sectional schematic view of an embodiment of a substrate processing chamber having the gas distributor;

FIG. 6*a* is a sectional schematic view of an embodiment of the gas distributor used in combination with a showerhead-style process gas distributor; and FIG. 6*b* is a schematic bottom view of the gas distributor and showerhead shown in FIG. 6*a*.

DESCRIPTION

Figure 2:
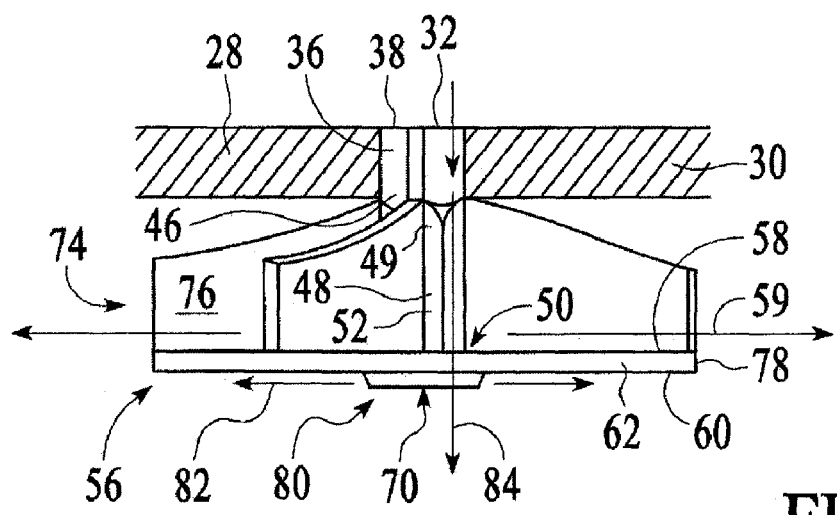
FIG. 2 is a side view of the gas distributor of FIG. 1.

An embodiment of a gas distributor 20, as illustrated in FIGS. 1 and 2, comprises a hub 22 having a first end 24 that fits in a cavity 26 of a chamber wall 30. The hub 22 has a gas inlet 32 for receiving gas and a gas outlet 34 for distributing the received gas across different surfaces inside a chamber.

The hub 22 comprises a plurality of first channels 36 having openings 38 and a terminus 46. The gas inlet 32 is defined by the openings 38 of the first channels 36 and receives a gas, such as a substrate processing gas or a cleaning gas, from an external source. In one version, the first channels 36 are defined by first grooves 40 on an external surface 42 of the hub 22 that mates with a surface 28 of the cavity 26 in the chamber wall 30. When the hub 22 is seated in the cavity 26, the first grooves 40 define the first channels 36 between the external surface 42 and the surface 28 of the cavity 26. In one version, the gas outlet 34 comprises the terminus 46 of the first channels 36. The first channels 36 can also be defined by other configurations, for example, the union of a flat (grooveless) external hub surface 42 with a grooved internal cavity surface 28 (not shown). Similarly, both surfaces could also have grooves, cut-outs, or spatially contoured regions, or both surfaces could also be smooth and the first channels 36 formed by a gap between the hub external surface and the cavity surface 28 (not shown).

The hub 22 also comprises a plurality of second channels 48 which have openings 49 which receive a gas flow from the first channels 36. The gas outlet 34 of the gas distributor 20 also comprises a terminus 50 of the second channels 48. In one version, the second channels 48 comprise second grooves 52 which continue along the hub 22 from the terminus 46 of the first channels 36 to a second end 54 of the hub 22. The gas outlet 34 comprising the terminus 46 of the first channels 36 and the terminus 50 of the second channels 48 is configured to direct gas across different surfaces in the chamber and about the distributor 20. For example, the terminus 46 of the first channels 36 can be configured to direct gas across first chamber surfaces, whereas the terminus 50 of the second channels 48 is positioned to direct gas across second chamber surfaces. The gas distributor 20 may be used, for example, to direct cleaning gas across each of the surfaces to more efficiently clean both surfaces of process residues. The gas distributor 20 is also useful to direct a gas such as a substrate processing gas, across gas reflecting surfaces, such as sidewalls or ceiling of a chamber, to provide a more uniform distribution of gas in the chamber for better substrate processing results. In the version of FIGS. 1 and 2, the gas distributor 20 also comprises a baffle 56 positioned at the second end 54 of the hub 22 and which extends radially outwardly from the hub 22. The baffle 56 has opposing first (or top) surface 58 and a second (or bottom) surface 60. The first surface 58 is configured to direct a flow 59 of at least a portion of the received gas from the terminus 46 of the first channels 36 along a particular direction or surface in the chamber. For example, the first surface 58 may be oriented at an inclined angle relative to the flow direction of gas from the terminus 46 of the the first channels 36 or even substantially perpendicular to the flow direction, as shown in FIG. 2. For example, the first surface 58 of the baffle 56 may be arranged to direct gas along a particular surface such as a chamber wall, for example, a ceiling or sidewall of the chamber, by providing a gas directing surface that is spaced apart from and parallel to the wall. While the baffle 56 is shown as extending radially outward from the second end 54 of the hub 22, it should be understood that the baffle 56 can also be placed at other positions along the hub 22, for example, at the first end 24 or midpoint of the hub 22. Also, in the version shown, the baffle 56 comprises a circular plate 62 that is arranged symmetrically about the hub 22. However, the baffle 56 can also comprise a non-circular plate, such as a rectangular or star shaped plate, and can also be positioned asymmetrically relative to the hub 22.

The baffle 56 comprises an aperture 64 positioned to receive at least a portion of the gas released from the terminus 46 of the first channels 36 and flowing along the second channels 48 of the hub 22. In one version, the aperture 64 coincides with the connection of the baffle 56 to the hub 22. The aperture 64 can also extend radially beyond the intersection of the hub 22 with the baffle 56. The baffle aperture 64 passes through the baffle 56 from the first surface 58 to the second surface 60 of the baffle 56. The intersection of the aperture 64 and the second surface 60 of the baffle forms the terminus 50 of the second channels 48. The baffle aperture 64 forms a passage for the second channels 48 through the baffle 56 to the terminus 50 of the second channels 48.

In one version, the hub 22 can also have a gas feed-through tube 66 to allow passage of a gas directly into a chamber. The gas feed-through tube 66 passes through the center of the hub 22 from the first end 24 of the hub 22 to the second end 54 of the hub 22. Gas is received by an inlet 68 of the the feed-through tube 66 at the first end 24 of the hub 22, and is passed directly into the chamber via a gas feed-through outlet 70 at the second end 54 of the hub 22, bypassing the first and second channels 36, 48. The gas feed through tube 66 allows the release of gas directly into the chamber. This version is useful when the gas distributor 20 requires two alternative gas pathways, for example, one to release a cleaning gas for cleaning surfaces and the other for releasing a gas comprising substrate processing components from directly above a substrate. The separate gas trajectories minimize erosion of the channels by an erosive cleaning or etching gas, or deposition on internal surfaces of the channels and other adjacent surfaces by a deposition gas. At the same time, cleaning gas can be directed along the requisite surfaces, and not simply be introduced straight into the chamber.

The gas distributor 20 also comprises a first set of vanes 74 that extend outward from the hub 22 along the first surface 58 of the baffle 56. The first vanes 74, in combination with the baffle 56, direct a portion 59 of the flow of gas from the terminus 46 of the first channels 36 outward from the hub 22 and across chamber surfaces. In one version, the each first vane 74 comprises an arcuate plate 76 that curves outward from the hub 22 to a perimeter 78 of the baffle 56. In one embodiment of this version, the arcuate plates 76 taper as they extend outward from the hub 22. The arcuate plates 76, as seen from a top view such as FIG. 3a, are equal members of a symmetric pattern, for example, a spiral pattern. The spiral pattern of the arcuate plates 76 imparts an outward, swirling directional motion to the flow 59 of a gas, such as a cleaning gas, across the chamber surfaces. The swirling gas pattern provides better cleaning of chamber surfaces by allowing the gas to distribute more uniformly across these surfaces and reduces stagnant gas regions. Uniformly distributed cleaning gas more effectively cleans the chamber surfaces by providing a gas flow path that by circulating removes stagnant gas from regions such as corners and crevices in the chamber. Also, the gas flow 59 can reduce corrosion of exposed chamber surfaces because a lower flow rate of gas can be used to more effectively clean the chamber surfaces, thereby reducing the likelihood that particular chamber regions or surfaces are exposed to excessive quantities of corrosive gas. Other embodiments of the first vanes 74 may comprise an arrangement of the arcuate plates 76 into a different pattern, which would impart a different directionality to the flow 59 of the cleaning gas across chamber surfaces. Alternate patterns could comprise a different type of curvature or symmetry and could be tailored to the type of cleaning gas or the composition and location of residues to be cleaned.

The gas distributor 20 also comprises a second set of vanes 80 on the second surface 60 of the baffle 56. The second vanes 80 are positioned at least partially below the terminus 50 of the second channels 48. A first portion 82 of the gas flow out of the terminus 50 of the second channels 48 is redirected by the second vanes 80 to flow across the second surface 60 of the baffle 56 and a second portion 84 passes uninhibited into the process chamber. The flow of gas across the second surface 60 of the baffle 56 cleans this surface 60, and thus, the gas distributor 20 is self cleaning. This self-cleaning can be especially useful as the second surface 60 is susceptible to the build-up of process residues because it generally faces the substrate in the chamber and thus proximate to a process zone in which processes are concentrated in the chamber. This is a significant advantage over prior art gas distributors which allowed build-up of residues on surfaces exposed to the plasma or process gas environment in the chamber and which were not exposed to direct flow streams of cleaning gas.

Each second vane 80 comprises a surface 86 inclined relative to the baffle second surface 60, as illustrated in FIG. 4, for directing the flow of gas. In one version, the inclined surfaces 86 are arranged in pairs. The arrangement of the inclined surfaces 86 into pairs 86a, b helps to organize their functionality. In the embodiment shown in FIG. 3b, two surfaces 86 are aligned at 90 degree angles to one another to form a pair of surfaces 86a, b. A single pair of surfaces 86a, b functions to direct a portion of the gas across a sector 90 of the baffle second surface 60. The baffle second surface 60 can be divided into a plurality of sectors 90. In the embodiment shown in FIG. 3b, the sector 90 of the baffle second surface 60 comprises one quarter of the baffle second surface 60. Each quarter of the baffle second surface 60 receives a flow of cleaning gas from a pair of surfaces 86a,b.

In other embodiments, the second vanes 80 may comprise different physical arrangements of the inclined surfaces 86 singly or in pairs. Alternate arrangements of the inclined surfaces 86 into pairs 86a, b may provide an alternate organization of the baffle second surface 60 into sectors 90. The inclined surfaces 86 may also be arranged singly into a pattern. Overall, the combination of all sectors 90 addressed by the second vanes surfaces 86 comprises substantially the entire baffle second surface 60 to provide cleaning of the second surface 60. In one version, the inclined surfaces 86 are plates 92 organized in a pattern positioned below the baffle aperture 64. For example, the plates 92 can be angled towards each other to form wedges 94. The wedges 94 are oriented with their apex 95 towards the second surface 60 of the baffle 56. Thus, in this version the second vanes 80 comprise a plurality of wedges 94 positioned below the baffle aperture 64, with their apexes 95 at least partially on the baffle second surface 60.

The angle of inclination of the inclined surfaces 86 relative to the baffle second surface 60, as shown by angle θ in FIG. 4, may be less than 90 degrees, or more preferably, from about 5 degrees to about 60 degrees. This angle θ may vary within this range to control the degree of redirection of the flow of the cleaning gas across the baffle second surface 60. A smaller angle of inclination θ will redirect a larger portion of the cleaning gas across the baffle second surface 60. A larger angle of inclination θ will redirect a smaller portion of the cleaning gas. The amount of cleaning gas redirected across the baffle second surface 60 may also be controlled by selecting the size of the aperture 64 and the area of the second vanes surfaces 86.

The gas distributor 20 according to the present invention may comprise a wide variety of materials, including metals, ceramics, semiconductors, glasses, polymers, plastics, or any other material suitable for use in a substrate processing chamber. For example, in one version, the gas distributor 20 may comprise one or more of aluminum, aluminum nitride, aluminum oxide. The gas distributor 20 may be manufactured by a wide variety of methods, including machining, molding, sintering, welding, assembly, bonding, or any other manufacturing method appropriate to the production of a component for use in a substrate processing chamber.

In one embodiment, the gas distributor 20 provides a cleaning gas to clean residues from a chemical vapor deposition (CVD) process, such as a high density plasma CVD (HDP-CVD) process. A substrate processing chamber 96 implementing such a process is the Ultima Plus HDP-CVD processing chamber, available from Applied Materials, Inc., located in Santa Clara, Calif. An exemplary embodiment of a HDP-CVD substrate processing chamber is illustrated schematically in FIG. 5. The chamber 96 may be fabricated from any of a variety of materials including metals, ceramics, glasses, polymers and composite materials. The fabrication of the chamber 96 is such that they can withstand and contain a process environment that may include extreme temperatures and pressures, as well as the presence of gases and plasmas. The chamber 96 illustrated in FIG. 5 is an example of a type of substrate processing chamber in which the gas distributor 20 can be used, however, the gas distributor 20 can also be used in other types of substrate processing chambers.

The process chamber 96 comprises chamber walls 30, which include top walls 98, sidewalls 100, and bottom walls 102. The chamber walls 30 may comprise flat, rectangular, arcuate, conical, dome or multi-radius arcuate shapes as shown in FIG. 5. The chamber walls 30 define a process zone 104 above a substrate 106 to be processed. The substrate 106 is typically held in the process zone 104 on a substrate support member 108 which may include a substrate support 110 such as electrostatic chuck which is chargeable to electrostatically hold the substrate 106.

A process gas supply 111 comprises a process gas inlet 113, a process gas source 112, and a process gas valve 114. For example, in the version shown in FIG. 5, the process gas inlet 113 comprise nozzles 116 that form a gas ring 118 which surrounds the process zone 104 and provides uniform gas delivery of a process gas to the process zone 104. The flow rate of process gas from the process gas source 112 to the process gas nozzles 116 is controlled by the process gas valve 114. The gases in the process zone 104 are exhausted by a gas exhaust 119 comprising an exhaust pump 120, such as a turbo molecular pump, and an exhaust conduit 121 having at least one valve, or for example a twin blade throttle valve 122 and a gate valve 124, to control the flow of gases and the pressure in the chamber 96. The process gas supply 111 and gas exhaust 119 are controlled by a controller 126.

The chamber 96 comprises interior chamber surfaces 128 on which process residues deposit, such as surfaces 128 that are exposed to the process gas during processing of a substrate 106. The interior chamber surfaces 128 can include surfaces of components such the chamber walls 30, substrate support 110, support member 108, process gas nozzles 116, throttle valve 122, or other component surfaces exposed to the interior of the chamber 96.

Gases can be energized in the chamber 96 by a gas energizer 129 adapted to couple RF or microwave energy to a gas in the process zone 104. In one version, the gas energizer 129 comprises inductor coils comprising a top coil 130 and a side coil 132 that can be powered by a RF power source 134 to couple RF energy to the gas. This dual coil system allows control of the radial ion density in the process chamber 96, thereby improving plasma uniformity. Although a dual-coil system allows for exemplary plasma control, a chamber 96 suitable according to the present invention may only comprise a gas energizer 129 having only one coil, or electrodes to capacitively couple energy, or a microwave activator to couple microwave energy.

In one version, the gas distributor 20 is part of a cleaning gas supply 136 comprising a cleaning gas source 138, a cleaning gas source control valve 140, a remote chamber or zone 142, and a cleaning gas flow control valve 146. The remote chamber 142 comprises a gas inlet 148, a remote gas activator 144 and a gas outlet 150. A cleaning gas can be energized in the remote chamber 142 by the remote gas activator 144 capable of coupling RF or microwave energy to the gas. The exact configuration of the gas outlet 150 and its connection to the process chamber 96 through the cleaning gas flow control valve 146 may vary depending on the type of energized cleaning gas. It may be important to limit the physical distance an energized cleaning gas has to travel as it passes from the remote chamber 142 to the process chamber 96. After distribution into the process chamber 96 by the gas distributor 20, the energized state of the cleaning gas may optionally be maintained by the chamber gas energizer 129, for example, by applying RF power to the top coil 130 and side coil 132. Alternatively, the cleaning gas may be initially energized by the chamber gas energizer 129 instead of the remote gas activator 144.

The chamber 96 comprises a power supply 152 to provide suitable bias voltages to components such as the substrate support member 108, electrostatic chuck 110, and top walls 98. The chamber 96 also comprises the controller 126 having program code to control components of the chamber 96. For example, the controller 126 can comprise gas flow control code to control a flow of gas into the chamber 96, gas energizer control code, substrate transport control code, temperature control code, exhaust system control code, and other control codes as needed for the operation of the substrate processing chamber 96.

The cleaning gas can have a varied chemical composition according to the type of residue being removed from the chamber 96. The cleaning gas may comprise both reactive and inert ingredients. Reactive ingredients can chemically interact with residues to remove them. Inert ingredients may be present to aid the energizing of the reactive ingredients. Inert ingredients may also be present to create a sputtering effect in which residues are physically removed. Reactive and inert ingredients may not always be easily identifiable from each other and may participate in or enhance the cleaning activities of the other.

In operation, a substrate 106 to be processed is transported into the process chamber 96 by a substrate transport, such as a robot arm, and is placed on the substrate support 110. Process gas is provided in the process zone 104 by the process gas supply 111 and energized by the gas energizer 129 to process the substrate 106. For example, in one version, the process gas may comprise a deposition gas include one or more of silane, $SiF_4$, oxygen, and nitrogen to deposit one or more of silicon dioxide, silicon nitride, and fluorosilicate glass on the substrate 106, and thereby generate residues on surfaces 128 in the chamber 96. The process gas can also be an etching gas such as fluorine, $SF_6$, chlorine, $BCl_3$ and $N_2$. Energized cleaning gas is provided in the chamber 96 by the cleaning gas supply 136 to clean the surfaces 128. For example, the cleaning gas may comprise one or more of $NF_3$, $C_2F_6$, and $CF_4$. The gases are exhausted from the chamber 96 by the gas exhaust 119.

In another aspect of the invention, the gas distributor 20 can distribute a cleaning gas in combination with a process gas distributor 156 to form a combination gas distributor 154. The combination gas distributor 154 comprises the process gas distributor 156 that introduces process gas into the chamber 96 and the cleaning gas distributor 20 that is fitted into the process gas distributor 156 to provide cleaning gas to the chamber 96. The gas distributor 20 may be fitted to a process chamber 96 containing a showerhead-style process gas distributor 156. A schematic view of this type of combination gas distributor 154 is schematically illustrated in FIGS. 6a, b. A process gas is introduced to the chamber 96 from a process gas distributor inlet 157 through a showerhead gas distribution faceplate 158. The showerhead faceplate 158 has a plurality of holes 160 through which the process gas enters the process zone 104. The gas distributor 20 is fitted below the center of the showerhead faceplate 157. For example, in one version, the gas distributor 20 is fitted to an aperture 159 in the showerhead faceplate 157 that can accommodate the hub of the gas distributor 20 and provide a connection between the gas distributor 20 and a flow of cleaning gas, for example, from a cleaning gas supply 136. A flow of cleaning gas is supplied to the gas distributor 20, which directs the cleaning gas along surfaces of the process gas distributor 156, including the showerhead faceplate 158, as well as into the chamber 96 and along interior surfaces 128 of the chamber 96.

The present invention has been described with reference to certain preferred versions thereof; however, other versions are possible. For example, the apparatus or cleaning process of the present invention can be used for treating chambers used in other types of applications, as would be apparent to one of ordinary skill. The apparatus or process can be applied to treat sputtering chambers, ion implantation chambers, etch chambers, or other types of deposition chambers, including thermal CVD, plasma-enhanced CVD (PECVD), or may be applied in combination with other types of cleaning processes. Also, the configuration of certain attributes of the gas distributor 20 described herein may be varied according to the parameters of the implementation, as would be apparent to one of ordinary skill. For example, the pattern of the first and second set of vanes 74, 80 may be altered to accommodate a different type of cleaning gas or a different type or location of residues to be cleaned. Therefore, the spirit and scope of the appended claims should not be limited to the description of the preferred versions contained herein.

What is claimed is:

1. A self-cleaning gas distributor capable of distributing a gas across surfaces in a substrate processing chamber, the gas distributor comprising:
    (a) a hub comprising a gas inlet to receive a gas and a gas outlet comprising first and second terminus to expel the received gas;
    (b) a baffle extending radially outward from the hub, the baffle having opposing first and second surfaces and comprising an outer perimeter;
    (c) a plurality of spaced apart first vanes on the first surface of the baffle, the plurality of first vanes extending upwards from the first surface and configured to direct the gas expelled from the first terminus across a chamber surface, each first vane comprising an arcuate plate that curves outward from the hub to the outer perimeter of the baffle; and
    (d) a plurality of second vanes on the second surface of the baffle, the plurality of second vanes comprising a plurality of surfaces that are inclined to the second surface of the baffle and wherein pairs of inclined surfaces are configured to direct the gas expelled from the second terminus across a sector of the second surface of the baffle to clean the gas distributor.

2. A gas distributor according to claim 1 wherein each arcuate plate tapers from the hub to the outer perimeter of the baffle.

3. A gas distributor according to claim 1 wherein the hub comprises first and second channels, and wherein the first terminus of the gas outlet pertains to the terminus of the first channels, and the second terminus of the gas outlet pertains to the terminus of the second channels.

4. A gas distributor according to claim 3 wherein, at least a portion of the inclined surfaces are below the terminus of the second channels.

5. A gas distributor according to claim 1 wherein the second vanes comprise a plurality of wedges.

6. A gas distributor according to claim 1 wherein the second vanes comprise surfaces that are inclined to the second surface of the baffle at an angle of about 5 degrees to about 60 degrees.

7. A gas distributor according to claim 1 wherein the hub comprises a gas feed-through tube capable of allowing a gas to bypass the first and second vanes and enter the chamber.

8. A combination process and cleaning gas distributor comprising the gas distributor according to claim 1 to distribute a cleaning gas, and a process gas distributor having a process gas inlet and a showerhead gas distribution faceplate.

9. A self-cleaning gas distributor to distribute a gas from an external source across surfaces in a substrate processing chamber having a wall with a cavity, the gas distributor comprising:
(a) a hub that fits into the cavity in the wall of the chamber, the hub comprising (i) a plurality of first channels on an external surface of the hub that mate with the cavity, each first channel comprising an opening and a first terminus, the opening capable of receiving the gas from the external source; (ii) a plurality of second channels, each second channel capable of receiving the gas from the first terminus of the first channels and expelling the gas from a second terminus; and (iii) a gas feed-through tube;
(b) a baffle plate extending radially outward from the hub, the baffle plate comprising first and second surfaces, an outer perimeter, and an aperture capable of allowing passage of the gas along the second channels;
(c) a plurality of spaced apart first vanes on the first surface of the baffle plate, the plurality of first vanes extending upwards from the first surface and configured to direct the gas expelled from the first terminus across the surfaces of the chamber, each first vane comprising an arcuate plate that curves outward from the hub;
(d) a plurality of second vanes on the second surface of the baffle plate, the plurality of second vanes configured to direct the gas expelled from the second terminus across the second surface of the baffle plate each second vane comprising a surface that is inclined to the second surface of the baffle plate and wherein adjacent pairs of inclined surfaces are configured to direct the gas across a sector of the second surface of the baffle plate to clean the gas distributor;
wherein the gas feed-through tube allows the gas to bypass the first and second set of vanes.

10. A gas distributor according to claim 9 wherein each arcuate plate tapers from the hub to the baffle plate outer perimeter.

11. A gas distributor according to claim 9 wherein at least a portion of the inclined surfaces are below the second terminus.

12. A substrate processing apparatus comprising:
(a) a remote chamber to activate a gas;
(b) a process chamber comprising chamber walls, interior chamber surfaces, a substrate support, a self-cleaning gas distributor, and a gas exhaust, the gas distributor being capable of receiving the gas from the remote chamber and distributing the gas into the process chamber, along the chamber walls and interior chamber surfaces, and about the gas distributor, the gas distributor comprising:
(i) a hub comprising a gas inlet to receive the gas, a gas outlet comprising first and second terminus to expel the received gas, and a gas feed-through tube;
(ii) a baffle extending radially outward from the hub, the baffle having opposing first and second surfaces and comprising an outer perimeter;
(iii) a plurality of spaced apart first vanes on the first surface of the baffle, the plurality of first vanes extending upwards from the first surface and configured to direct the gas expelled from the first terminus across the chamber walls and interior chamber surfaces, each first vane comprising an arcuate plate that curves outward from the hub to the outer perimeter of the baffle; and
(iv) a plurality of second vanes on the second surface of the baffle, the second vanes each comprising a surface that is inclined to the second surface of the baffle and wherein adjacent pairs of inclined surfaces are configured to direct the gas expelled from the second terminus across a sector of the second surface of the baffle to clean the gas distributor;
wherein the gas feed-through tube allows a gas to bypass the first and second vanes.

13. A substrate processing apparatus according to claim 12 wherein the remote chamber comprises a gas inlet, gas activator, and a gas outlet.

14. A substrate processing apparatus according to claim 12 wherein the first vanes are capable of distributing an energized cleaning gas from the remote chamber along the chamber walls and interior chamber surfaces.

15. A substrate processing apparatus according to claim 12 wherein the second vanes are capable of distributing an energized cleaning gas from the remote chamber about the gas distributor.

16. A substrate processing apparatus according to claim 12 wherein the gas feed-through tube is capable of distributing an energized process gas from the remote chamber into the process chamber.

* * * * *